(12) United States Patent
Lee et al.

(10) Patent No.: US 9,261,546 B2
(45) Date of Patent: Feb. 16, 2016

(54) TOUCH SENSING CIRCUIT AND METHOD

(71) Applicant: PRINCETON TECHNOLOGY CORPORATION, New Taipei (TW)

(72) Inventors: Wei-Lung Lee, New Taipei (TW);
Chieh Yung Tu, New Taipei (TW);
Chien-Hsien Tsai, New Taipei (TW)

(73) Assignee: PRINCETON TECHNOLOGY CORPORATION, New Taipei (TW)

( * ) Notice: Subject to any disclaimer, the term of this patent is extended or adjusted under 35 U.S.C. 154(b) by 208 days.

(21) Appl. No.: 13/842,563

(22) Filed: Mar. 15, 2013

(65) Prior Publication Data

US 2014/0139242 A1 May 22, 2014

(30) Foreign Application Priority Data

Nov. 16, 2012 (TW) .............................. 101142753 A

(51) Int. Cl.
*G01R 23/00* (2006.01)
*G01R 27/26* (2006.01)
*G06F 3/044* (2006.01)
*G06F 3/02* (2006.01)
*G06F 3/041* (2006.01)
*H03K 17/96* (2006.01)

(52) U.S. Cl.
CPC .......... *G01R 27/2605* (2013.01); *G06F 3/0202* (2013.01); *G06F 3/044* (2013.01); *G06F 3/0418* (2013.01); *H03K 17/962* (2013.01); *H03K 2217/960725* (2013.01)

(58) Field of Classification Search
CPC ...... G01R 23/00; G01R 23/005; G01R 27/26; G01R 27/2605; H03K 17/962; H03K 17/955; H03K 2217/960725; G06F 3/0418; G06F 3/0202
USPC .............................................. 324/686, 76.41
See application file for complete search history.

(56) References Cited

U.S. PATENT DOCUMENTS

| 5,790,107 A * | 8/1998 | Kasser et al. ................. 345/174 |
| 2004/0108861 A1* | 6/2004 | Germiquet et al. ........... 324/663 |
| 2008/0179112 A1* | 7/2008 | Qin et al. .................... 178/18.06 |
| 2010/0250180 A1* | 9/2010 | Lu et al. ........................ 702/104 |
| 2010/0328269 A1 | 12/2010 | Kurokawa |
| 2011/0074445 A1* | 3/2011 | Nascimento .................. 324/676 |

FOREIGN PATENT DOCUMENTS

| CN | 1790909 A | 6/2006 |
| TW | 201035842 A | 10/2010 |

* cited by examiner

*Primary Examiner* — Son Le
(74) *Attorney, Agent, or Firm* — Muncy, Geissler, Olds & Lowe, P.C.

(57) ABSTRACT

A touch sensing circuit is provided. The touch sensing circuit includes: a touch capacitor, for being touched; a touch capacitor frequency detection unit, coupled to the touch capacitor, for detecting an output frequency from the touch capacitor; a reference frequency generation unit, for generating a reference frequency; a calculation unit, coupled to the touch capacitor frequency detection unit and the reference frequency generation unit, for calculating the variation of the difference between the output frequency from the touch capacitor and the reference frequency; and a determination unit, coupled to the calculation unit, for determining whether the touch capacitor is being touched based on whether the variation of the difference is greater than a criterion value.

5 Claims, 6 Drawing Sheets

TOUCH SENSING CIRCUIT AND METHOD

CROSS REFERENCE TO RELATED APPLICATIONS

This Non-provisional application claims priority under 35 U.S.C. §119(a) on Patent Application No(s). 101,142,753, filed in Taiwan, Republic of China on Nov. 16, 2012, the entire contents of which are hereby incorporated by reference.

BACKGROUND OF THE INVENTION

1. Field of the Invention

The present invention relates to touch sensing technology, and in particular, relates to technology for improving the sensitivity of the touch sensing device.

2. Description of the Related Art

Touch technology has significantly changed our daily lives, and touch sensing devices have gradually replaced the conventional mechanical switches on the control interfaces of some electronic devices such as home appliances, mobile phones and computers.

The purpose of the capacitive touch devices is to process capacitance variation of capacitive switches caused by human touch. Since the capacitance variation is quite weak, the outside temperature, humidity, and electromagnetic interference are likely to cause the touch devices to malfunction, or even cause an entire device to fail. When a user holds a touch device, various behaviors may result in inconsistent responses of the touch device, in addition, sensitivity of the touch devices is often affected by process drift when being manufactured.

The touch devices in the prior art have to be carefully tested and tuned in the manufacturing process to maintain high quality and avoid the mentioned circumstances. However, this is not only time-consuming and labor-intensive, but also limits the application of the touch devices.

BRIEF SUMMARY OF THE INVENTION

The present invention provides a touch sensing circuit. The touch sensing circuit comprises: a touch capacitor, for being touched; a touch capacitor frequency detection unit, coupled to the touch capacitor, for detecting an output frequency from the touch capacitor; a reference frequency generation unit, for generating a reference frequency; a calculation unit, coupled to the touch capacitor frequency detection unit and the reference frequency generation unit, for calculating the variation of the difference between the output frequency from the touch capacitor and the reference frequency; and a determination unit, coupled to the calculation unit, for determining whether the touch capacitor is being touched based on whether the variation of the difference is greater than a criterion value.

The present invention further provides a. touch sensing method. The touch sensing method comprises: detecting an output frequency from a touch capacitor; generating a reference frequency; calculating the variation of the difference between output frequency of the touch capacitor and the reference frequency; determining that the touch capacitor is being touched when the variation of the difference is greater than a criterion value.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In order to overcome the shortcomings of the prior art and enhance the sensitivity and the anti-interference capability of the touch device, the present invention provides a capacitive touch sensing circuit and a touch sensing method. Various embodiments of the present invention will hereinafter be described with reference to the drawings.

Touch Sensing Circuit

Figure 1:
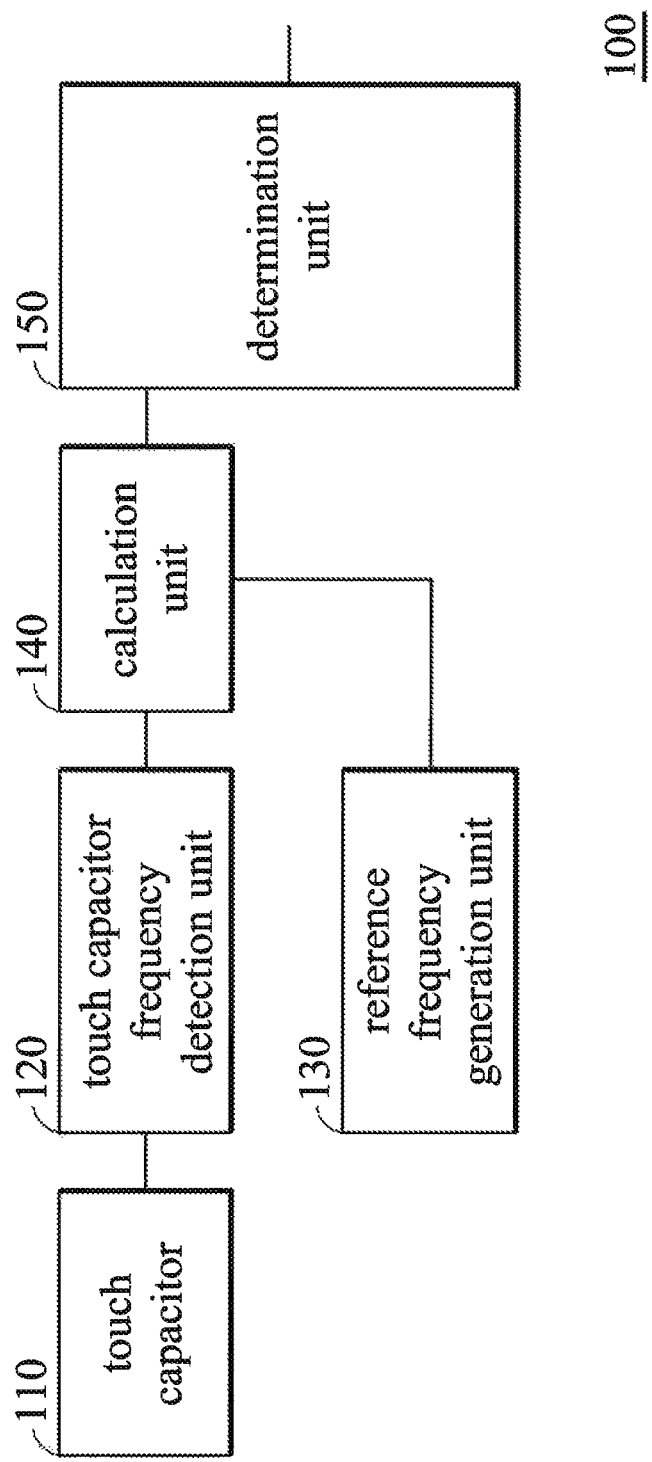
FIG. 1 is a block diagram of a capacitive touch sensing circuit according to an embodiment of the present invention.

FIG. 1 is a block diagram of a capacitive touch sensing circuit according to an embodiment of the present invention. The capacitive touch sensing circuit 100 of the present invention comprises a touch capacitor 110, a touch capacitor frequency detection unit 120, a reference frequency generation unit 130, a calculation unit 140 and a determination unit 150. The touch capacitor 110 is used to be touched by a user, and its capacitance Cs will be changed due to the touch. Generally, the capacitance Cs of the capacitor 110 increases when being touched.

Figure 2:
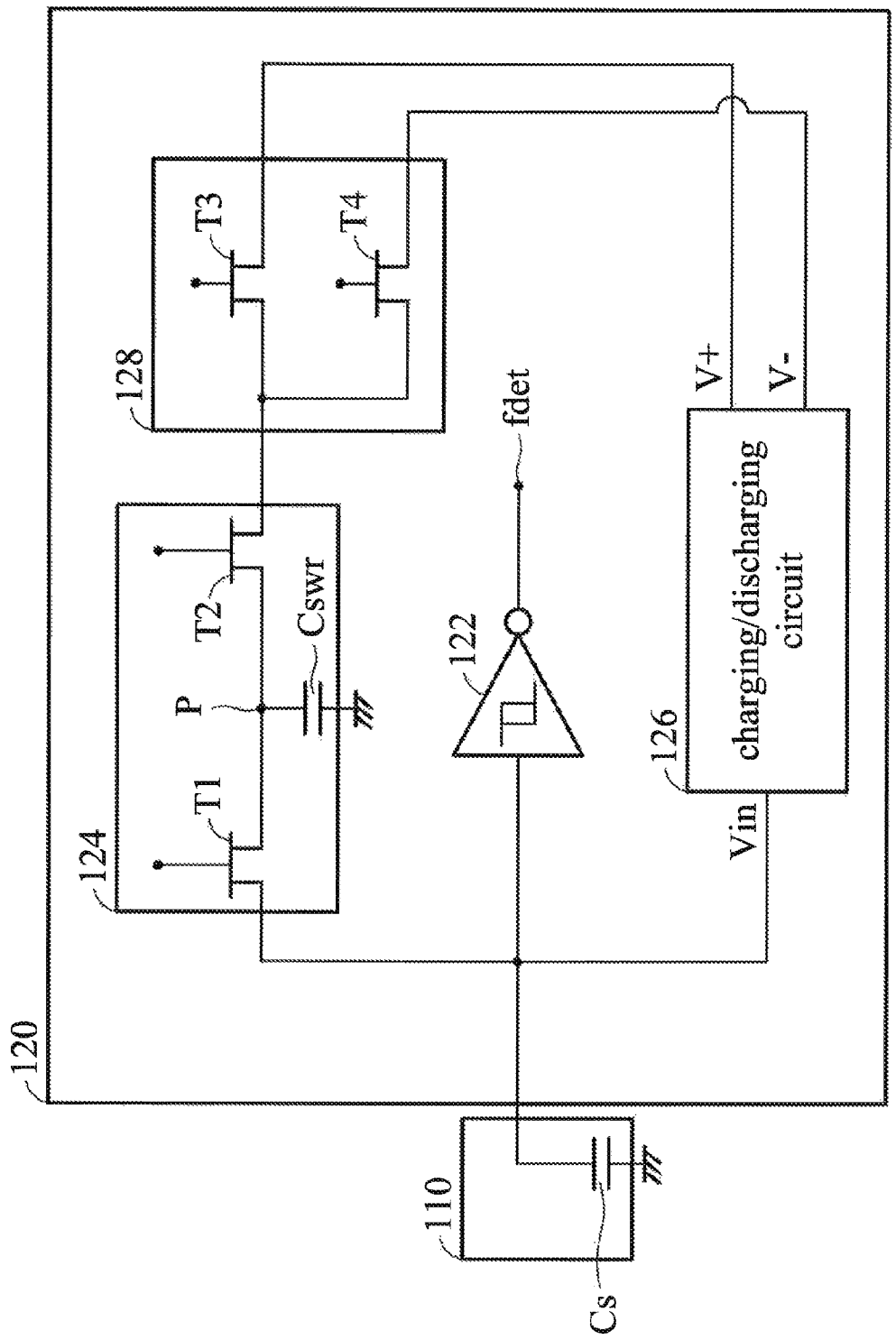
FIG. 2 is a schematic diagram of the touch capacitor frequency detection unit 120 and the touch capacitor 110 according to an embodiment of the present invention.
Figure 3:
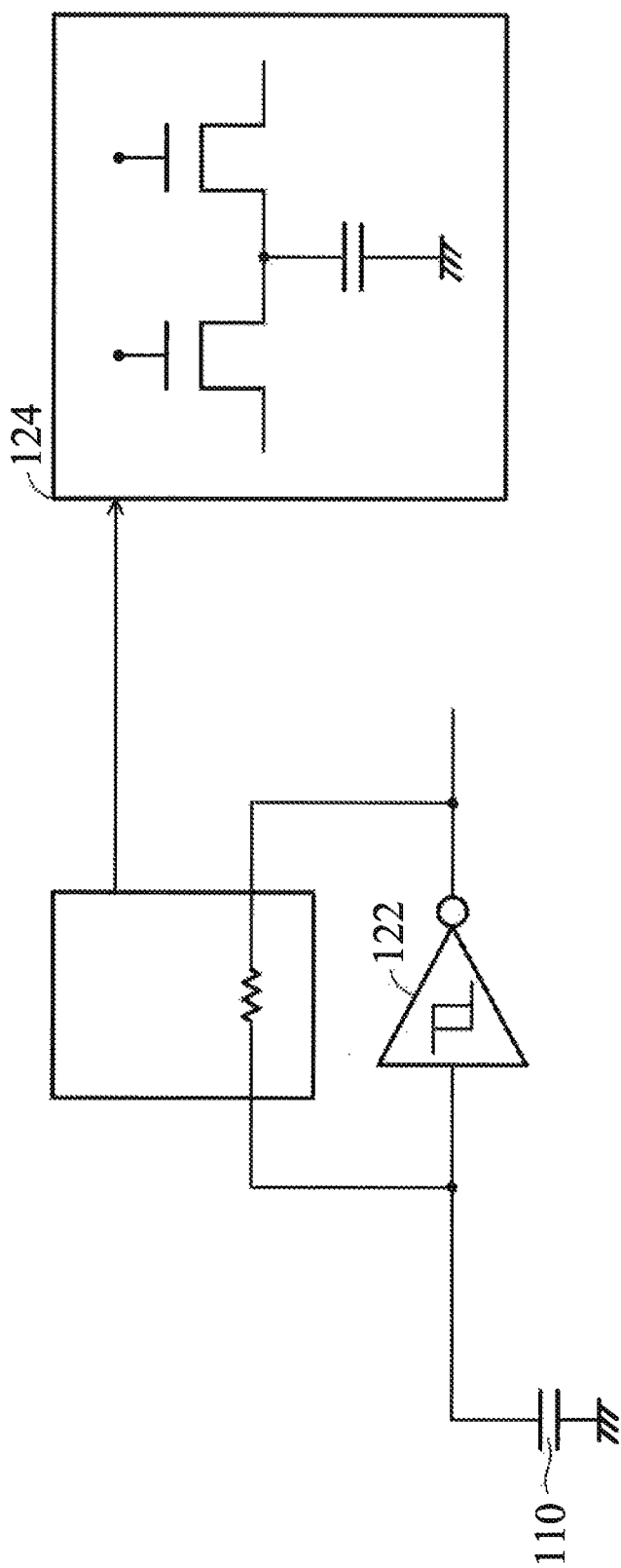
FIG. 3 shows a resistor that connects the input end and the output end of the Schmitt trigger 122 together.

As shown in FIG. 1, the touch capacitor frequency detection unit 120 of the present invention is coupled to the touch capacitor 110 for detecting an output frequency fdet from the touch capacitor 110. FIG. 2 is a schematic diagram of the touch capacitor frequency detection unit 120 and the touch capacitor 110 according to an embodiment of the present invention. In this embodiment, the touch capacitor frequency detection unit 120 comprises a Schmitt trigger 122, a switching capacitor network 124, a charging/discharging circuit 126 and a set of charging switches 128. The Schmitt trigger 122 in the present invention is an oscillating structure, which is coupled to the touch capacitor 110 and is used to generate bi-stable oscillation signal according to the variation of the capacitance Cs. The bi-stable oscillation signal can be used in a signal processing procedure. As shown in FIG. 3, in the prior art, a resistor is usually used to connect the input end and the output end of the Schmitt trigger 122 together. However, in order to control the output frequency fdet from the touch capacitor 110 more precisely, in the present invention, a switching capacitor network 124 is used to replace the resistor. The switching capacitor network 124 will be discussed later. The traditional resistor is replaced by the switching capacitor network 124 in this embodiment; however, those skilled in the art can appreciate that the present invention should not be limited thereto. The switching capacitor network 124 is coupled to the input end of the Schmitt trigger 122, and has two switch transistors T1 and T2 and a ground capacitor Cswr. The switch transistors T1 and T2 are both connected to the node P, and alternatively turn on and off according to a switching frequency fswr. The ground capacitor Cswr is connected between the node P and ground end. The equivalent resistance Rswr of the switching capacitor network 124 is equal to: 1/(Cswr×fswr). Therefore, the output frequency fdet of the Schmitt trigger 122 can be expressed as: fdet=1/(K×Rswr×Cs), i.e., fdet/fswr=(1/K)×(Cswr/Cs), wherein K is a constant around 0.69. From this equation it can be found that the touch capacitor 110 can generate an output frequency fdet with suitable magnitude when the switching frequency fswr between the transistors T1 and T2 of the switching capacitor network 124 is properly controlled. The switching capacitor network 124 of the present invention can not only digitalize the output signals from the touch capacitor 110, but also can more precisely control the range of the output frequency of the touch capacitor 110, thus improving the sensitivity of the touch sensing circuit 100 for user's touches.

Figure 4:
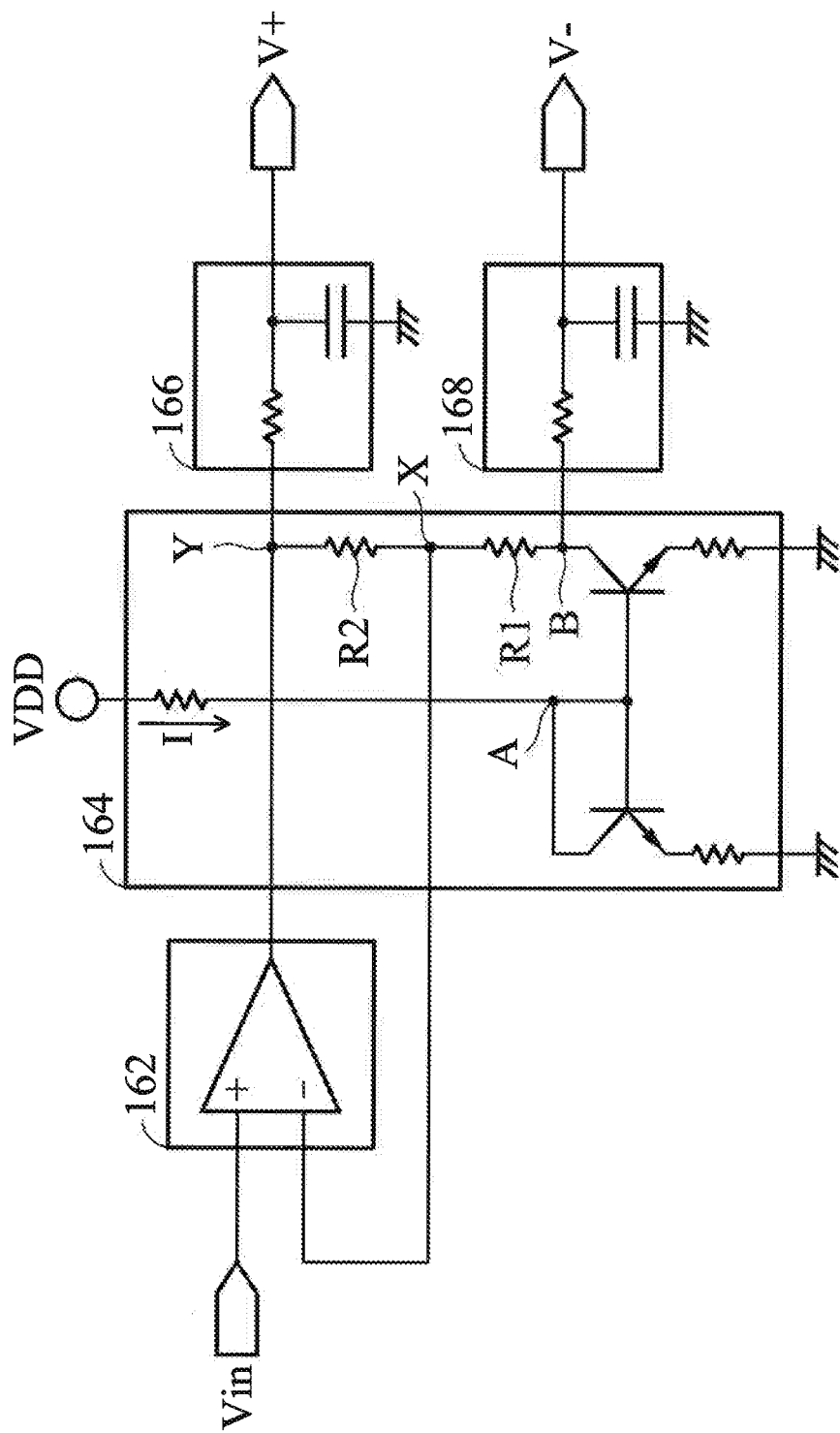
FIG. 4 is a schematic diagram of the charging/discharging circuit according to an embodiment of the present invention.

The charging/discharging circuit 126 is coupled to the touch capacitor 110 via the charging switches 128 and the switching capacitor network 124 for providing a charging voltage V+ and a discharging voltage V− to the touch capacitor 110. Please refer to FIGS. 2 and 4. FIG. 4 is a schematic diagram of the charging/discharging circuit according to an embodiment of the present invention. The charging/discharging circuit 126 at least comprises an operational amplifier 162 and a current mirror 164. The operational amplifier 162 is coupled to the touch capacitor 110 for receiving an actual voltage Vin of the touch capacitor 110. Specifically, the operational amplifier 162 of the present invention is a unit gain amplifier, and is used to ensure the voltage on the node X between the resistors R1 and R2 is identical to the actual voltage. The current mirror 164 is coupled to a power source VDD with an input end A, and is connected to a first resistor R1 in series with an output end B. The first resistor R1 is further connected to the second resistor R2 in series. In an embodiment, the first resistor R1 and the second resistor R2 have the same resistances. The node X between the first resistor R1 and the second resistor R2 receives the actual voltage Vin on the touch capacitor 110. Since the first resistor R1 and the second resistor R2 have the same resistances, the current I produces the same cross voltage ΔV on them, so that the first resistor R1 outputs the discharging voltage V− (equal to Vin−ΔV) on the node and the second resistor R2 outputs the charging voltage V+ (equal to Vin+ΔV) on the node Y. Finally, the transistors T3 and T4 in the charging switch 128 are respectively turned on or off according to the timing of charging and discharging of the touch capacitor 110. Specifically, when the touch capacitor 110 is charged, the transistor T3 is turned on and the transistor T4 is turned off; and when the touch capacitor 110 is discharged, the transistor T3 is turned off and the transistor T4 is turned on. The purpose of the charging/discharging circuit 126 of the present invention is to quickly equilibrate the voltage level of the touch capacitor 110 to enhance the quality of charging and discharging and promote the sensitivity of the touch sensing circuit of the present invention 100. In some embodiments, as shown in FIG. 4, the charging/discharging circuit 126 of the present invention further comprises filters 166 and 168 for further stabilizing the charging and discharging voltage. However, the filters 166 and 168 are merely for illustration, and the present invention should not be limited thereto.

Figure 5:
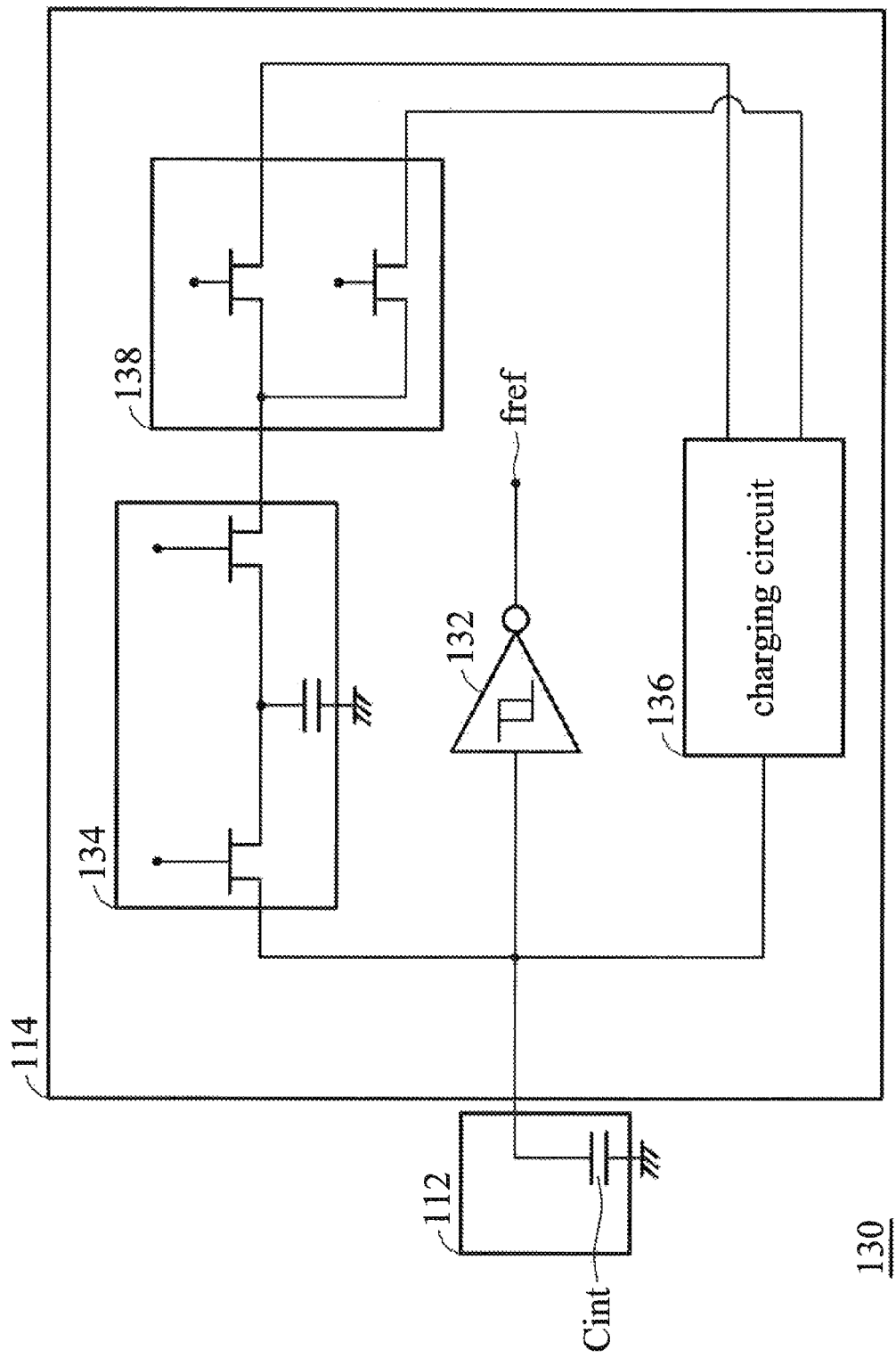
FIG. 5 is a schematic diagram of the reference frequency generation unit 130 according to an embodiment of the present invention.

The reference frequency generation unit 130 of the present invention is used to generate a reference frequency fref which is close to but not equal to the output frequency from the touch capacitor fdet that is detected by the touch capacitor frequency detection unit 120. FIG. 5 is a schematic diagram of the reference frequency generation unit 130 according to an embodiment of the present invention. In this embodiment, the reference frequency generation unit 130 comprises a reference capacitor 112 and a reference capacitor frequency sampling unit 114. The capacitance of the reference capacitor 112, Cint, is close to but not equal to that of the touch capacitor 110. In a better embodiment, the reference capacitor frequency sampling unit 114 has the same circuitry structure as that of the touch capacitor frequency detection unit 120, and at least comprises a Schmitt trigger 132, a switching capacitor network 134, a charging/discharging circuit 136 and a set of charging switches 138. Those skilled in the art can understand the structure and the function of the reference frequency generation unit 130 by referring to the touch capacitor frequency detection unit 120 described above. As the reference frequency generation units 130 and the touch capacitor frequency detection units 120 are manufactured on the same integrated circuit in the same process, the process drift factors can be appropriately eliminated.

Refer to FIG. 2. The main advantages of the present invention come from the calculation unit 140. The calculation unit 140 can further enhance touch sensitivity of the present invention and eliminate the drift factors. Specifically, the calculation unit 140 can calculate the difference variation between the output frequency from the touch capacitor fdet detected by the touch capacitor frequency detection unit 120 and the reference frequency fref generated by reference frequency generation unit 130. In an example, assume that the output frequency of the touch capacitor fdet is 10 kHz when the touch capacitor 110 has not been touched, and becomes 9 kHz when the touch capacitor 110 has been touched (generally, when a human body touches the capacitor, the capacitance value becomes larger and its output frequency becomes smaller). In addition, assume that the reference frequency fref provided by the reference frequency generation unit 130 is 11 kHz (close but not equal to the output frequency from the touch capacitor fdet). Note that the value of the reference frequency fref is not influenced by the touches. The touch in the prior art is usually determined by detecting the "variation" of the output frequency of the touch capacitor, but this "variation" is only 10% (=(9 kHz−10 kHz)/10 kHz) in this example and quite easy to be ignored due to the drift factors and various influences. Different from the prior art, the calculation unit 140 of the present invention first subtracts the value of the reference frequency fref from the value of the output frequency of the touch capacitor fdet to obtain a difference, and then calculates the variation of the difference (hereinafter, "difference variation" for short) due to the touches. In this example, the difference variation is 100% (=(2 kHz−1 kHz)/1 kHz), ten times the variation of 10% in the prior art. The sensitivity n the present invention is magnified tenfold and thus advantageous to the sensing and detecting of the touches. The calculation unit 140 of the present invention is mainly composed of a subtracter and a divider (not shown). Since the calculation unit 140 can be constructed from various components, its detailed structure will not be further discussed here.

The determination unit 150 of the present invention can store an appropriate value of the difference variation as a criterion value in advance. Afterwards, whenever the value of the difference variation calculated by the calculation unit 140 is greater than the criterion value, the determination unit 150 can determine whether the touch capacitor 110 is being touched and complete the touch sensing procedure. Note that changes in the external environment (for example, changes in the power, the ambient temperature and humidity) may influence the difference variation described above. Therefore, in some embodiments, the calculation unit 140 can calculate the difference variations for various environments and the determination unit 150 can store the results as the criterion values to cope with various situations.

Touch Sensing Method

Figure 6:
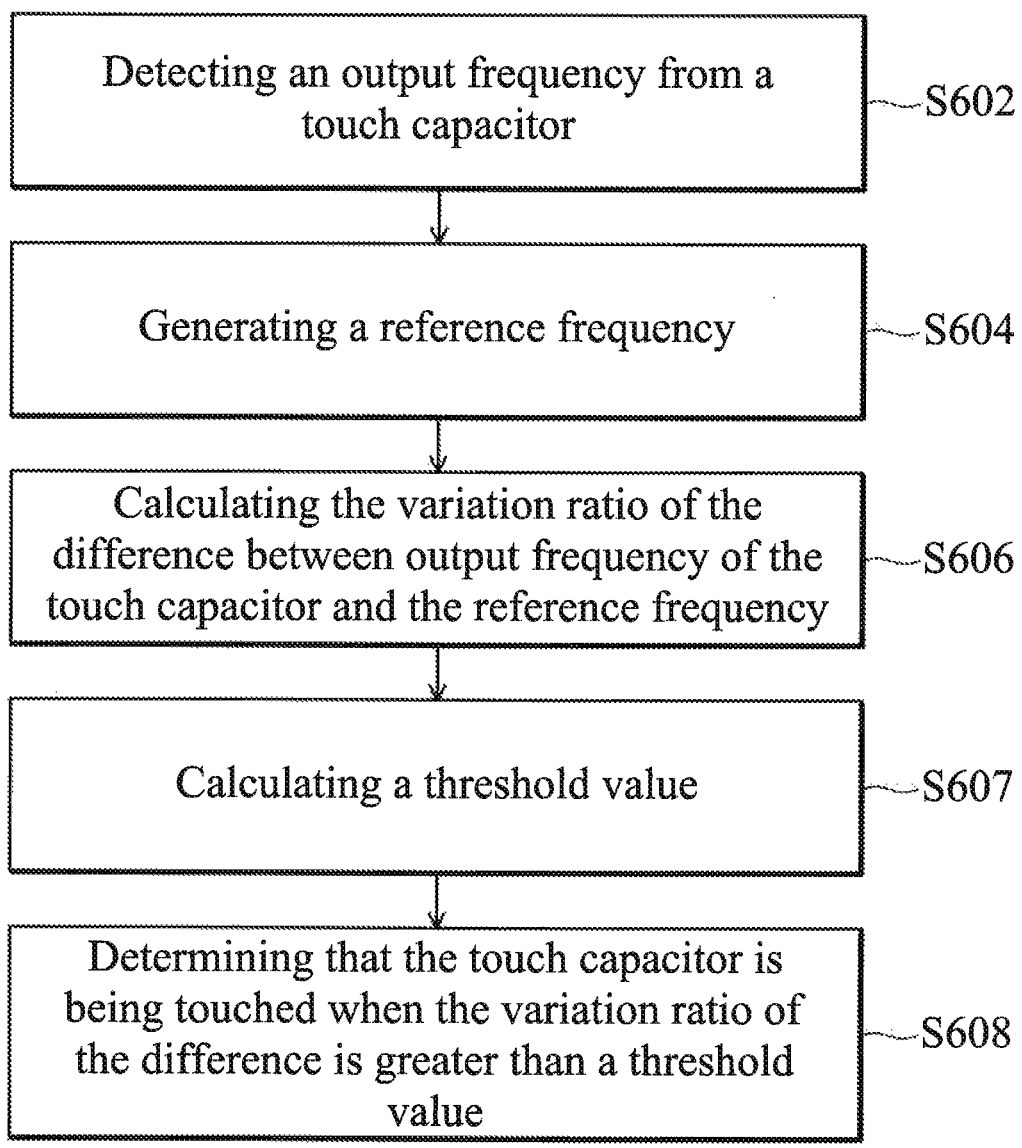
FIG. 6 is a flow chart of the touch sensing method according to an embodiment of the present invention.

In addition to the touch sensing circuit, the present invention further provides a touch sensing method. FIG. 6 is a flow chart of the touch sensing method according to an embodiment of the present invention. The touch sensing method 600 comprises: in step S602, detecting an output frequency from a touch capacitor; in step S604, generating a reference frequency; in step S606, calculating the variation ratio of the difference between output frequency of the touch capacitor and the reference frequency; in step S607, calculating a threshold value, and in step S608, determining that the touch capacitor is being touched when the variation ratio of the difference is greater than a threshold value. Note that in a preferred embodiment, in step S604, the reference frequency should be close to but not equal to the output frequency of the touch capacitor. Those skilled in the art can understand each step of the touch sensing method 600 by referring to the touch sensing circuit described above, therefore the other embodiments of this method will not be further discussed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A touch sensing circuit, comprising:
    a touch capacitor, for being touched;
    a touch capacitor frequency detection unit, coupled to the touch capacitor, for detecting an output frequency from the touch capacitor;
    a reference frequency generation unit, for generating a reference frequency;
    a calculation unit, coupled to the touch capacitor frequency detection unit and the reference frequency generation unit, for obtaining a difference between the output frequency from the touch capacitor and the reference frequency and calculating a variation rate of the difference accordingly; and
    a determination unit, coupled to the calculation unit, for determining whether the touch capacitor is being touched based on whether the variation rate of the difference is greater than a criterion value, wherein the touch capacitor frequency detection unit further comprises:
        a Schmitt trigger having an input end for connecting to an input end of the touch capacitor in series; and
        a switching capacitor network, wherein the switching capacitor network is coupled to the input end of the Schmitt trigger, and the switching capacitor network further comprises:
            two switch transistors, both connected to a node, and alternatively turned on and off according to a switching frequency; and
            a ground capacitor, connected to the node and a ground end.

2. The touch sensing circuit as claimed in claim 1, wherein the reference frequency is close to but not equal to the output frequency from the touch capacitor.

3. The touch sensing circuit as claimed in claim 1, wherein the reference frequency generation unit further comprises:
    a reference capacitor; and
    a reference capacitor frequency sampling unit, coupled to the reference capacitor, for detecting an output frequency from the reference capacitor, wherein the reference capacitor frequency sampling unit and the touch capacitor frequency detection unit have the same circuitry structure.

4. A touch sensing circuit, comprising:
    a touch capacitor, for being touched;
    a touch capacitor frequency detection unit, coupled to the touch capacitor, for detecting an output frequency from the touch capacitor;
    a reference frequency generation unit, for generating a reference frequency;
    a calculation unit, coupled to the touch capacitor frequency detection unit and the reference frequency generation unit, for obtaining difference between the output frequency from the touch capacitor and the reference frequency and calculating a variation rate of the difference accordingly; and
    a determination unit, coupled to the calculation unit, for determining whether the touch capacitor is being touched based on whether the variation rate of the difference is greater than a criterion value, wherein the touch capacitor frequency detection unit further comprises a charging/discharging circuit, coupled to the touch capacitor for providing a charging voltage and a discharging voltage to the touch capacitor, and the reference frequency generation unit comprises a set of charging switches, coupled between the charging/discharging circuit and the touch capacitor, for controlling the charging/discharging circuit, and the charging/discharging circuit further comprises:
        a current mirror, having an input end connected to a power, and an output end connected to a first resistor in series, wherein the first resistor is further connected to a second resistor in series, and the first resistor and the second resistor is connected to a node, wherein the node is used to receive an actual voltage of the capacitor, the first resistor is used to output the discharging voltage, and the second resistor is used to output the charging voltage.

5. The touch sensing circuit as claimed in claim 4, wherein the first resistor and the second resistor have the same resistance.

* * * * *